(12) United States Patent
Varadarajan et al.

(10) Patent No.: US 11,895,803 B2
(45) Date of Patent: Feb. 6, 2024

(54) FAN FOR AN ELECTRONIC DEVICE

(71) Applicant: INTEL CORPORATION, Santa Clara, CA (US)

(72) Inventors: Krishnakumar Varadarajan, Bangalore (IN); Arvind Sundaram, Bangalore (IN); Srinivasarao Konakalla, Bangalore (IN); Yogesh Channaiah, Karnataka (IN); Satyajit Siddharay Kamat, Bangalore (IN); Raghavendra N, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 712 days.

(21) Appl. No.: 16/914,311

(22) Filed: Jun. 27, 2020

(65) Prior Publication Data

US 2020/0329583 A1 Oct. 15, 2020

(51) Int. Cl.
*H05K 7/20* (2006.01)
*F04D 25/06* (2006.01)
*F04D 29/58* (2006.01)
*F04D 17/16* (2006.01)
*G06F 1/20* (2006.01)
*F04D 29/28* (2006.01)

(52) U.S. Cl.
CPC ......... *H05K 7/20172* (2013.01); *F04D 17/16* (2013.01); *F04D 25/0606* (2013.01); *F04D 29/281* (2013.01); *F04D 29/5806* (2013.01); *F04D 29/5813* (2013.01); *G06F 1/203* (2013.01)

(58) Field of Classification Search
CPC . H05K 7/20172; F04D 17/16; F04D 25/0606; F04D 29/281; F04D 29/5806; F04D 29/5813
See application file for complete search history.

(56) References Cited

U.S. PATENT DOCUMENTS

| 4,459,087 | A | * | 7/1984 | Barge | ..................... | H02K 1/246 |
| | | | | | | 416/189 |
| 4,553,075 | A | * | 11/1985 | Brown | .................. | F04D 25/066 |
| | | | | | | 310/68 R |
| 4,618,806 | A | * | 10/1986 | Grouse | .................. | H02K 29/08 |
| | | | | | | 318/400.41 |
| 4,642,534 | A | * | 2/1987 | Mitchell | ................ | H02K 25/00 |
| | | | | | | 318/400.26 |

(Continued)

FOREIGN PATENT DOCUMENTS

| JP | 2005113730 | A | * | 4/2005 | | |
| JP | 2005127311 | A | * | 5/2005 | ............. | F04D 17/16 |

(Continued)

*Primary Examiner* — Robert J Hoffberg
(74) *Attorney, Agent, or Firm* — Patent Capital Group

(57) ABSTRACT

Particular embodiments described herein provide for an electronic device that includes a fan. The fan can include a center shaft, fan blades that extend from the center shaft, and a plurality of magnets on an outside portion of at least two of the fan blades, where stator coils interact with the magnets to drive the blades around the center shaft. The center shaft and fan blades are a single component from the same material. In some examples, the center shaft and fan blades were created using a metal injection molding process.

20 Claims, 9 Drawing Sheets

(56) References Cited

U.S. PATENT DOCUMENTS

| | | | | |
|---|---|---|---|---|
| 4,949,022 A * | 8/1990 | Lipman | H02K 29/08 | 318/696 |
| 5,474,429 A * | 12/1995 | Heidelberg | H02K 7/14 | 310/63 |
| 5,616,974 A * | 4/1997 | Yamada | H02K 29/03 | 310/68 B |
| 6,194,798 B1 | 2/2001 | Lopatinsky | | |
| 6,249,071 B1 * | 6/2001 | Lopatinsky | H02K 7/14 | 254/254 |
| 6,309,190 B1 * | 10/2001 | Chen | F04D 29/056 | 417/423.1 |
| 6,351,044 B1 * | 2/2002 | Miyahara | F04D 25/0653 | 257/E23.099 |
| 6,388,346 B1 * | 5/2002 | Lopatinsky | H02K 1/2753 | 417/423.1 |
| 6,457,955 B1 * | 10/2002 | Cheng | F04D 25/066 | 165/122 |
| 6,525,938 B1 * | 2/2003 | Chen | F04D 25/066 | 310/91 |
| 6,527,522 B2 * | 3/2003 | Chen | F04D 25/066 | 417/423.1 |
| 6,606,578 B1 * | 8/2003 | Henderson | B64D 27/24 | 702/145 |
| 6,670,737 B2 * | 12/2003 | Chen | H02K 7/14 | 310/194 |
| 6,700,781 B2 * | 3/2004 | Chia-Kuan | F04D 25/066 | 415/178 |
| 6,744,172 B2 * | 6/2004 | Duhua | H02K 7/14 | 310/254.1 |
| 6,896,492 B2 * | 5/2005 | Masterton | F04D 25/066 | 310/68 B |
| 6,911,757 B2 * | 6/2005 | Lopatinsky | H02K 7/14 | 310/DIG. 6 |
| 6,923,619 B2 * | 8/2005 | Fedoseyev | F04D 25/066 | 415/206 |
| 7,032,859 B2 * | 4/2006 | Mohr | H02K 16/02 | 244/12.3 |
| 7,075,200 B2 * | 7/2006 | Minato | H02K 41/03 | 310/67 R |
| 7,112,910 B2 * | 9/2006 | Lopatinsky | H02K 21/24 | 310/156.32 |
| 7,192,258 B2 * | 3/2007 | Kuo | F04D 25/066 | 417/356 |
| 7,402,932 B2 * | 7/2008 | Applegate | H02K 21/14 | 310/112 |
| 7,443,065 B2 * | 10/2008 | Chen | H02K 7/14 | 310/71 |
| 7,887,289 B2 * | 2/2011 | Tokunaga | F04D 25/0606 | 415/206 |
| 8,177,530 B2 * | 5/2012 | Horng | F04D 25/0653 | 310/156.32 |
| 8,251,681 B2 * | 8/2012 | Tsai | H02K 21/145 | 310/216.001 |
| 8,297,921 B2 * | 10/2012 | Tokunaga | F04D 29/059 | 415/206 |
| 8,536,970 B2 * | 9/2013 | Liang | H02K 3/26 | 336/200 |
| 9,140,263 B2 * | 9/2015 | Horng | F04D 17/04 | |
| 10,473,107 B1 * | 11/2019 | Newton | B64U 30/20 | |
| 10,612,552 B2 * | 4/2020 | Varland | F04D 29/526 | |
| 10,718,339 B2 * | 7/2020 | Patton | F04D 25/06 | |
| 11,018,540 B2 * | 5/2021 | Kim | H02K 11/215 | |
| 11,081,914 B2 * | 8/2021 | Kim | H02K 1/146 | |
| 11,255,216 B2 * | 2/2022 | Chong | B64D 27/10 | |
| 11,293,457 B2 * | 4/2022 | Li | F04D 29/662 | |
| 11,506,178 B2 * | 11/2022 | Marcel | H02K 7/1823 | |
| 11,691,743 B2 * | 7/2023 | Karikomi | B64D 35/02 | 417/423.12 |
| 2002/0021973 A1 * | 2/2002 | Nelson | H02K 7/14 | 417/355 |
| 2003/0123226 A1 * | 7/2003 | Chen | F04D 29/023 | 361/695 |
| 2003/0124001 A1 * | 7/2003 | Chen | F04D 25/066 | 417/423.7 |
| 2004/0086394 A1 * | 5/2004 | Kohonen | F04D 25/066 | 417/356 |
| 2005/0147501 A1 * | 7/2005 | Cheng | F04D 25/0606 | 417/423.3 |
| 2013/0189130 A1 * | 7/2013 | Chang | F04D 25/062 | 417/354 |
| 2014/0309965 A1 * | 10/2014 | Horng | F04D 25/0653 | 702/170 |
| 2014/0377093 A1 * | 12/2014 | Horng | F04D 25/064 | 417/410.1 |
| 2017/0067470 A1 * | 3/2017 | Patton | G06F 1/203 | |
| 2021/0156387 A1 * | 5/2021 | Chiu | F04D 29/526 | |
| 2023/0225074 A1 * | 7/2023 | Tsoukatos | G06F 1/20 | 361/695 |

FOREIGN PATENT DOCUMENTS

| | | | | |
|---|---|---|---|---|
| WO | WO-2009033699 A1 * | 3/2009 | | F04D 17/105 |
| WO | WO-2011092863 A1 * | 8/2011 | | F04D 25/066 |

* cited by examiner

FAN FOR AN ELECTRONIC DEVICE

TECHNICAL FIELD

This disclosure relates in general to the field of computing and/or device cooling, and more particularly, to a fan for an electronic device.

BACKGROUND

Emerging trends in systems place increasing performance demands on the system. The increasing demands can cause thermal increases in the system. The thermal increases can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1A:
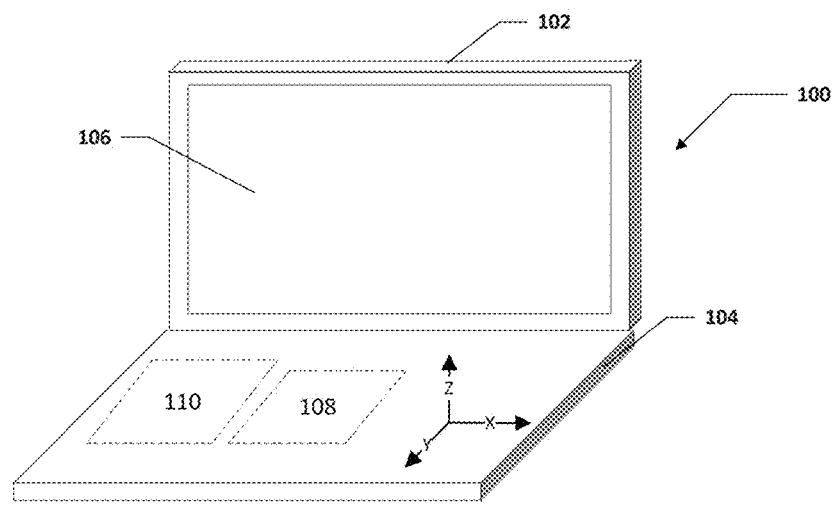
FIGS. 1A and 1B are a simplified block diagram of an electronic device that includes a fan for the electronic device, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a fan for an electronic device. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer or component disposed over or under another layer or component may be directly in contact with the other layer or component or may have one or more intervening layers or components. Moreover, one layer or component disposed between two layers or components may be directly in contact with the two layers or components or may have one or more intervening layers or components. In contrast, a first layer or first component "directly on" a second layer or second component is in direct contact with that second layer or second component. Similarly, unless explicitly stated otherwise, one feature disposed between two features may be in direct contact with the adjacent features or may have one or more intervening layers.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

FIG. 1A is a simplified block diagram of an electronic device that includes a fan for the electronic device, in accordance with an embodiment of the present disclosure. In an example, electronic device 100 can include a first housing 102 and a second housing 104. First housing 102 can include a display 106. Second housing 104 can include a fan 108 and a heat source 110. In an example, electronic device 100 is a laptop computer.

Figure 1B:
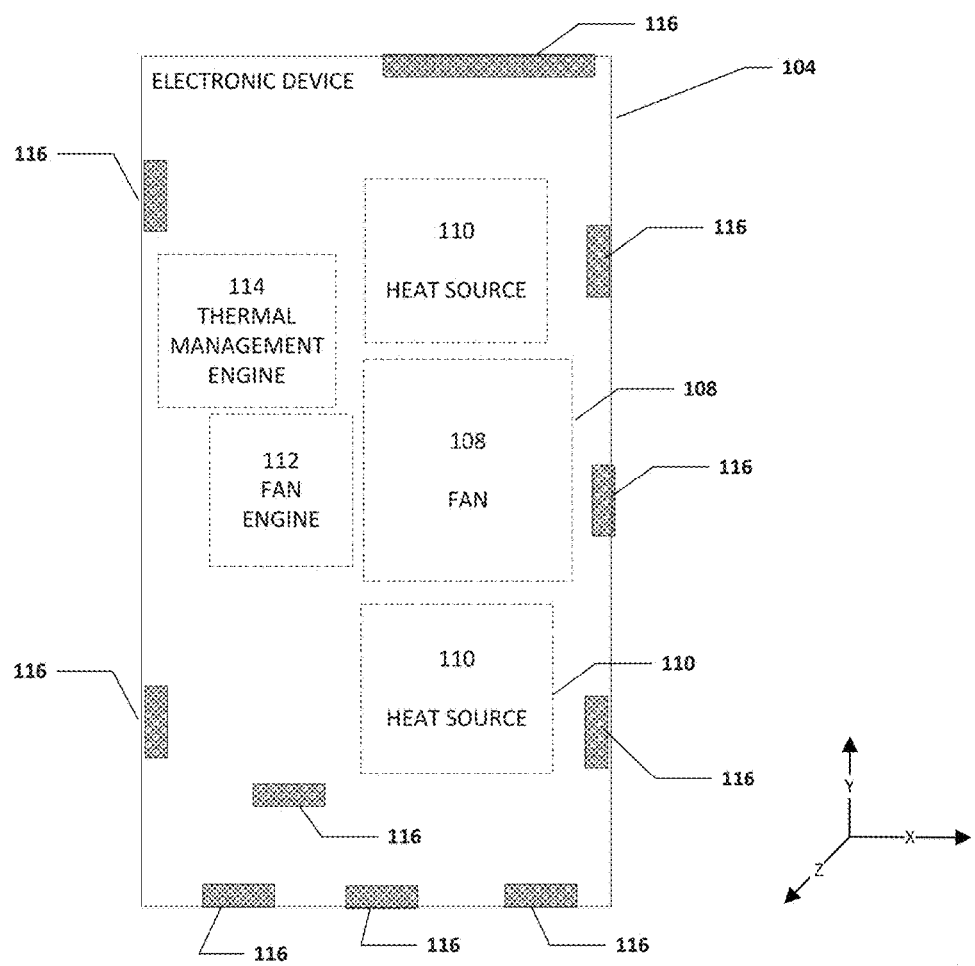

Turning to FIG. 1B, FIG. 1B is a simplified block diagram of an electronic device that includes a fan for the electronic device, in accordance with an embodiment of the present disclosure. In an example, second housing 104 can include fan 108, one or more heat sources 110, a fan engine 112, a thermal management engine 114, and one or more vents 116. Vents 116 do not all need to be the same type of vent and each of one or more vents 116 may be an inlet vent, an outlet vent, or a combination inlet and outlet vent.

Each of one or more heat sources 110 may be a heat generating device (e.g., processor, logic unit, field programmable gate array (FPGA), chip set, a graphics processor, graphics card, battery, memory, or some other type of heat generating device). Fan 108 can be configured as an air-cooling system to help reduce the temperature or thermal energy of one or more heat sources 110. Fan engine 112 can be configured to control the velocity or speed of fan 108. Thermal management engine 114 can be configured to collect data or thermal characteristics related to one or more heat sources 110 and other components, elements, or devices (e.g., battery, device or group of devices available to assist in the operation or function of electronic device 100, etc.) in electronic device 100 and communicate the data to fan engine 112. When a temperature of electronic device 100 and/or one or more heat sources 110 satisfies a threshold temperature (e.g., a maximum operating temperature of one or more heat sources 110), fan engine 112 can activate fan 108. The term "thermal characteristics" includes a temperature of electronic device 100, a temperature of one or more heat sources 110, and/or a measurement, range, indicator, etc. of an element or condition that affects the thermal response, thermal state, and/or thermal transient characteristics of one or more heat sources 110. The thermal characteristics can include a platform workload intensity, a CPU workload or processing speed, fan speed, air temperature (e.g., ambient air temperature, temperature of the air inside the platform, etc.), power dissipation, or other indicators that may affect the temperature of second housing 104.

In an example, fan 108 can be configured to include a plurality of magnets on the outer edge of the fan blades. Stator coils can be located on a base (e.g., a printed circuit board, motherboard, or some other substrate or base) proximate to fan 108 and fan engine 112 can use the stator coils to drive the fan blades by interacting with the plurality of magnets on the outer edge of the fan blades. The magnets on the outer edge of the fan blades and stator coils located on the base relocate the motor portion of fan 108 to the periphery of fan 108 and allow the stator coils to be decoupled from the center shaft of fan 108. Because fan 108 is rotated from the edges of fan 108 and not from the center shaft, the center diameter of fan 108 can be reduced and in some examples, the performance of fan 108 can be increased.

Because the motor portion of fan 108 to the periphery of fan 108, fan 108 can be created as a single component made from the same material. In an example, fan 108 can be made using a molding process with the fan blades and shaft as a single component or solid component. In a specific example, fan 108 can be created using a metal injection molding process. Metal injection molding is a metalworking process in which finely-powdered metal is mixed with binder material to create a feedstock that is then shaped and solidified using injection molding by injecting molten material into a mold. Because fan 108 can be made as a single component or solid piece, the effect of the wobble of fan 108 caused by the misalignment between the shaft and fan blades can be reduced. This creates less wobble while fan 108 is running and allows the height of fan 108 to be increased as well as allow for an increase in the velocity of fan 108 and/or the flow rate of air from fan 108.

Center driven fan blades are typically made of plastic and a metal shaft where the fan blades are secured to the metal shaft by welding (e.g., laser welding). During this welding process, it can be relatively difficult to maintain the perpendicularity of the axis of the shaft to the plane of the blade sweep. This limitation can cause the fan to wobble while the fan is running. Wobble of the fan can cause increased noise, reduce the flow rate of air from the fan, etc. Also, the wobble can cause additional wear and tear on the bearings and other parts of the fan and reduce the lifetime of the fan. More specifically, the wobble in the fan can cause bearing oil to pump out and shorten the life of the fan as the fan bearings wear out at a much faster rate than a fan without wobble. By manufacturing the fan blades with an integrated shaft, the effect of the wobble of the fan caused by the misalignment between the shaft and blade can be reduced.

More specifically, molding the fan blades, rotor, and shaft as a single component from the same material can help reduce wobble of fan 108 that is caused by misalignment, especially with the rotor. Because the wobble is reduced, there is less of a chance the rotating parts of fan 108 will contact the chassis of electronic device 100 and the air gap requirement of some current fans can be reduced from about 1.5 millimeters to about 0.8 millimeters. The reduction in the airgap can improve the performance of fan 108 by allowing for an increased fan height as compared to some current fans. With the reduced air gap, the overall system Z-height of the housing (e.g., second housing 104) that includes fan 108 can be reduced by more than one (1) millimeter. The reduction of the wobble allows for a thinner chassis of the housing with less air gap and can help allow for a system with a relatively low Z-height and reduction in overall system weight, as compared to some devices that include current fan designs. The term "Z height," "Z location," etc. refers to the height along the "Z" axis of an (x, y, z) coordinate axis or cartesian coordinate system.

It is to be understood that other embodiments may be utilized and structural changes may be made without departing from the scope of the present disclosure. Substantial flexibility is provided by electronic device 100 in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment.

For purposes of illustrating certain example techniques of electronic device 100, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. However, the increase in performance and/or function causes an increase in the thermal challenges of the devices and systems. One of the most common solutions to address the thermal challenges of devices and systems is to use a fan.

Most existing fans used in electronic devices are manufactured with a sleeve bearing and a stator section. The stator section includes a journal sleeve, motor coils, and a motor printed circuit board. The stator section is attached to a fan supporting plate that has fan mounting holes to secure the fan to the chassis or housing of the electronic device. The sleeve bearing is attached to the stator coils while the shaft is laser welded to the fan rotor. During this welding process, it can be relatively difficult to maintain the perpendicularity of the axis of the shaft to the plane of the blade sweep. This limitation can cause the fan to wobble while the fan is running. Wobble of the fan can cause increased noise, reduce the flow rate of air from the fan, etc. Also, the wobble can cause additional wear and tear on the bearings and other parts of the fan and reduce the lifetime of the fan.

One way to increase the ability of the fan to cool a device is to increase the flow of the air from the fan. However, in order to achieve ultra-thin form factors, some current dish fans and standard blower solutions have limitations in fan thickness verses fan performance. For example, to increase the flow of the air from the fan, the fan's diameter can be increased. However, as the fan's diameter is increased, any wobble of the fan, especially from misalignment, is exacerbated. Some current fans cannot increase in diameter to increase the air flow because that will induce an unacceptable amount of wobble. Also, due to manufacturing tolerances, most current fans have a wobble that requires a relatively high air gap requirement between the rotating parts of the fan and the chassis to accommodate the wobble. The need for the relatively high air gap requirement to accommodate the wobble creates issues with the aspect ratio of the fan when the blade diameter is increased.

To help support an ultra-thin form factor device (e.g., less than thirty-six (36) millimeters in total Z-height), the chassis skin thickness needs to be reduced to less than about 0.8 millimeters to achieve a smaller system Z-height thickness. However, a thin chassis thickness is not possible throughout the chassis area as a few regions of the chassis require about one (1) millimeter to meet test loading conditions, especially in the fan region. Typically, a dish fan or external motor fans are caseless and these are directly mounted on one side of the chassis and on the other side of the chassis, there is a gap to help the rotating members of the fan avoid touching the chassis and to account for fan wobble. In addition, there is a strict requirement that the chassis in close proximity to the rotating parts of the fan needs to be stiff and must pass test loading conditions. The deflection of the chassis near the fan region remains a critical issue when thickness of the chassis is less than about 0.8 millimeters and will force a system design with a higher air gap between the rotating parts of the fan and the chassis to avoid having the rotating parts of the fan coming into contact with the chassis and to account for fan wobble. What is needed is a fan that can help to reduce the wobble of the fan and help reduce the Z-height of the electronic device.

A fan that can help to reduce the wobble of the fan and help reduce the Z- height of the electronic device, as outlined in FIG. 1A can resolve these issues (and others). In an example, an electronic device (e.g., electronic device 100) can include a fan where the motor is decoupled from the center shaft of the fan and moved to the outer edges of the fan. In addition, the fan can be created using a metal injection molding process or some other molding process where the fan blades and shaft are created as a single component. Metal injection molding is a metalworking process in which finely-powdered metal is mixed with binder material to create a feedstock that is then shaped and solidified using injection molding by injecting molten material into a mold of the fan. Secondary operation on the shaft can be achieved with relatively high tolerances for concentricity and perpendicularity between the central shaft connected to a bearing and the fan blades to reduce wobble of the fan.

To maintain fan speed, even if the weight of the fan is increased due to the fan being created using metal injection molding, magnets can be located on the outer edge of the fan blades, instead of with magnets in the rotor hub to allow the stator coils to be decoupled from the center shaft of the fan. The magnets can create a radial magnetic field at the periphery of the fan rotor without obstructing air flow from the fan. The stator coils can be discrete stator coils located on a base (e.g., a printed circuit board, motherboard, or some other substrate or base) and aligned to the magnets on the fan blades and actuated based on a standard back electro motive force (BEMF) based control of brushless direct current (BLDC) motors. By placing magnets on blades of the fan at the periphery of the rotor with stator coils on the base, there is an increased torque for rotation due to longer moment arm length. Also, because the stator coils are decoupled from the center portion of the fan and located on the base, the height of the stator coils can be increased to achieve a desired revolutions per minute of the fan.

In addition, because the stator coils are decoupled from the center shaft of the fan and moved to the periphery of the fan, the diameter of the hub of the fan can be reduced as compared to some current fan designs. In addition, there is an overall decrease in the pressure drop during operation of the fan and this can provide a higher flow of air from the fan. Also, the fan can help to reduce system Z-height for the same performance as compared to some existing fans or give more performance for the same system thickness as compared to some existing fans. The smaller hub of the fan can reduce inlet resistance and allow for thinner taller blades of the fan. In addition, the number of fan blades can be increased to provide an increase in air flow from the fan. The larger fan diameter enables the fan to push more air for an increase in air flow and overall, the increase in air flow allows for thinner fan sizes to high aspect ratio fans which helps to enable ultra-thin form factors.

In an example implementation, electronic device 100, is meant to encompass a computer, a personal digital assistant (PDA), a laptop or electronic notebook, a cellular telephone, smartphone, network elements, network appliances, servers, routers, switches, gateways, bridges, load balancers, processors, modules, or any other device, component, element, or object that includes at least a heat source and a fan. Electronic device 100 may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Electronic device 100 may include virtual elements.

In regards to the internal structure, electronic device 100 can include memory elements for storing information to be used in the operations outlined herein. Electronic device 100 may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions outlined herein may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for the operations described herein. This includes the memory elements being able to store software, logic, code, or processor instructions that are executed to carry out the activities described herein.

In an example implementation, electronic device 100 may include software modules (e.g., fan engine 112, thermal management engine 114, etc.) to achieve, or to foster, operations as outlined herein. These modules may be suitably combined in any appropriate manner, which may be based on particular configuration and/or provisioning needs. In example embodiments, such operations may be carried out by hardware, implemented externally to these elements, or included in some other network device to achieve the intended functionality. Furthermore, the modules can be implemented as software, hardware, firmware, or any suitable combination thereof. These elements may also include software (or reciprocating software) that can coordinate with other network elements in order to achieve the operations, as outlined herein.

Additionally, electronic device 100 may include a processor that can execute software or an algorithm to perform activities as discussed herein. A processor can execute any type of instructions associated with the data to achieve the operations detailed herein. In one example, the processors could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Implementations of some of the embodiments disclosed herein may be formed or carried out on a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

Figure 2:
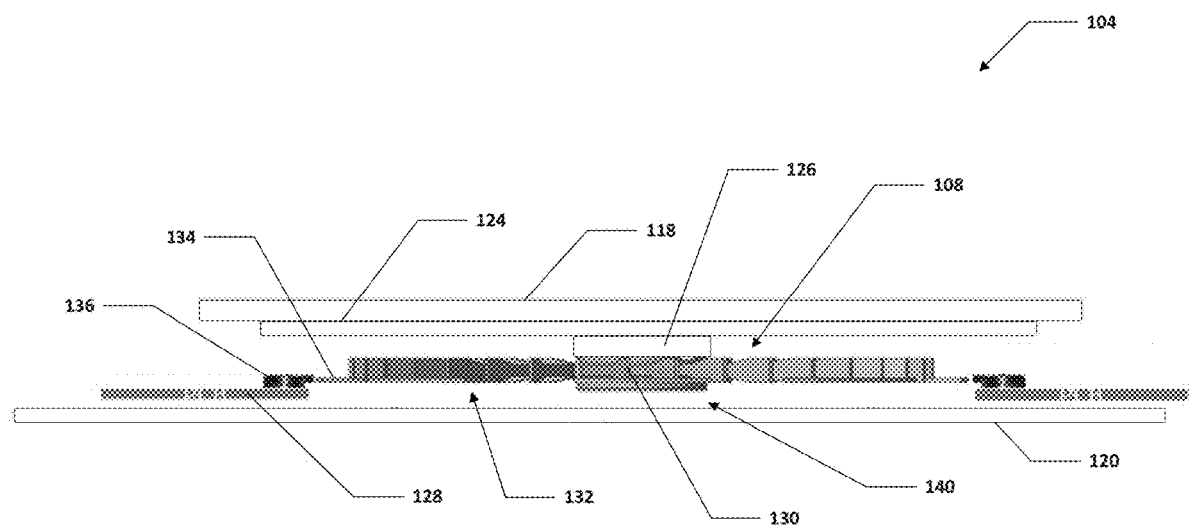
FIG. 2 is a simplified block diagram of a portion of a system to enable a fan for an electronic device, in accordance with an embodiment of the present disclosure.

Turning to FIG. 2, FIG. 2 is a simplified side view cutaway block diagram of a portion of an electronic device that includes a fan for the electronic device, in accordance with an embodiment of the present disclosure. In an example, a second housing 104 can include a top cover 118 and a bottom cover 120. In some examples, second housing 104 may be a standalone device where there is not a first housing (e.g., a tablet, smartphone, etc.). Top cover 118 and bottom cover 120 can be part of the chassis of second housing 104. Second housing 104 can also include fan 108, a support plate 124, a fan rotation mechanism 126, and a base 128. Fan 108 can include a center shaft 130 and fan blades 132. At least two of fan blades 132 can each include a magnet 134. Base 128 can include stator coils 136. Base 128 can be a printed circuit board, motherboard, or some other substrate or base. Magnet 134 is a permanent magnet (e.g., neodymium iron boron, samarium cobalt, etc.)

In an example, support plate 124 can be secured to top cover 118. Fan rotation mechanism 126 can be coupled to support plate 124. Center shaft 130 of fan 108 can be coupled to fan rotation mechanism 126. Support plate 124 is configured to help support fan 108 and fan rotation mechanism 126. Fan rotation mechanism 126 allows center shaft 130 and fan blades 132 of fan 108 to rotate.

In an example, a thermal management engine (e.g., thermal management engine 114 illustrated in FIG. 1B) can monitor the thermal characteristics of second housing 104. Thermal management engine 114 can communicate with fan engine 112 (illustrated in FIG. 1B) that fan 108 needs to be activated to cool second housing 104. When stator coils 136 are activated by fan engine 112 (illustrated in FIG. 1B), magnets 134 on fan blades 132 interact with stator coils 136 and fan rotation mechanism 126 allows fan 108 to rotate. Because magnets 134 are on the outer edge of fan blades 132a and stator coils 136 are located on base 128, the motor portion of fan 108 is located on the periphery of fan 108. This allows fan 108 to be created as a single component using a molding process with the fan blades and shaft as a single component created from the same material. In a specific example, fan 108 can be created using an injection molding process (e.g., metal injection molding) where material is shaped and solidified by injecting molten material into a mold of fan 108. Molding fan 108 as a single component can help reduce wobble of fan 108 that is caused by misalignment between center shaft 130 and fan blades 132 and the reduction in wobble allows a gap 140 between center shaft 130 and bottom cover 120 to be relatively small when compared to some current fan designs. For example, gap 140 may be about 0.8 millimeters or less. In another example, gap 140 may be about one (1) millimeter or less. In yet another example, gap 140 may be about 1.5 millimeters or less. In another example, gap 140 may be about 0.8 millimeters to about one (1) millimeter. In yet another example, gap 140 may be about 0.5 millimeters to about one (1) millimeters. Is still yet another example, gap 140 may be about 0.5 millimeters to about 0.8 millimeters.

Figure 3:
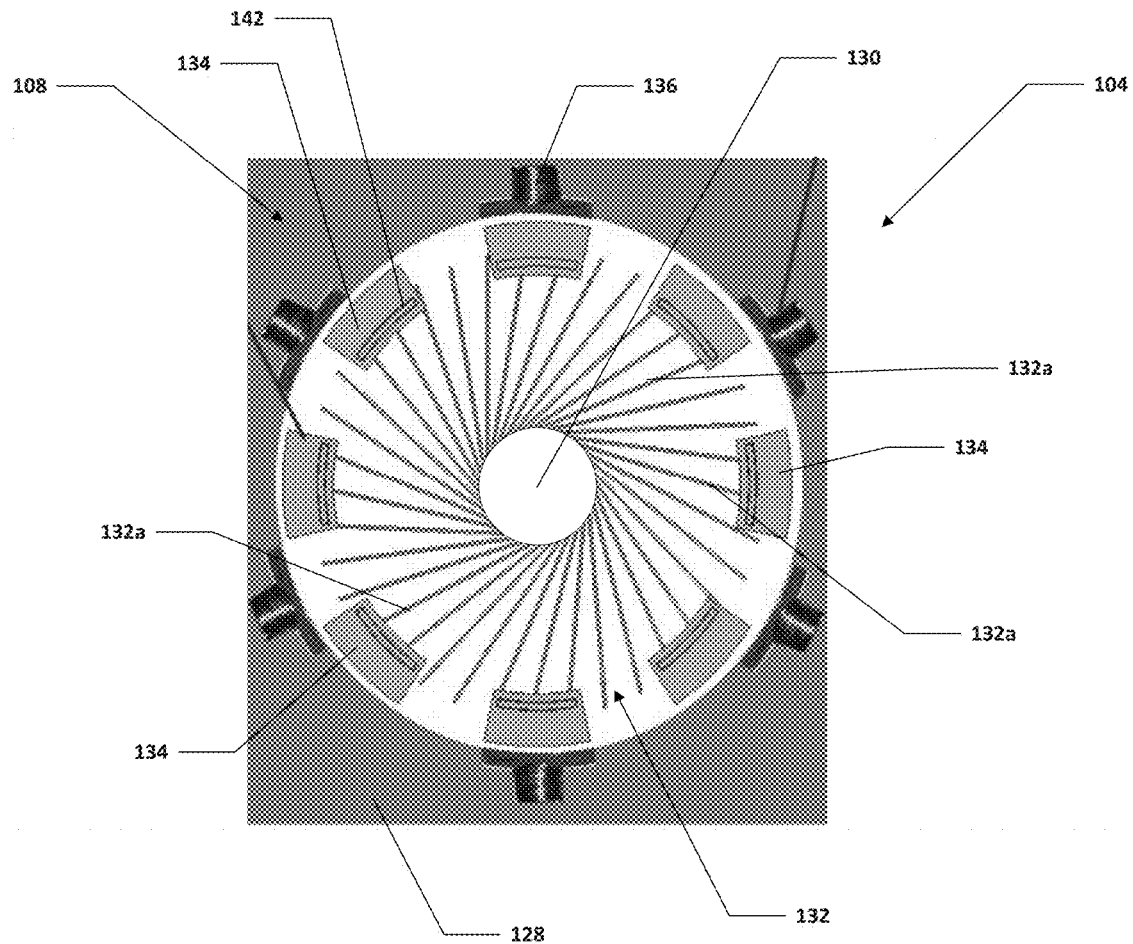
FIG. 3 is a simplified block diagram of a portion of a system to enable a fan for an electronic device, in accordance with an embodiment of the present disclosure.

Turning to FIG. 3, FIG. 3 is a simplified block diagram top cutaway view of a portion of an electronic device that includes a fan for the electronic device, in accordance with an embodiment of the present disclosure. In an example, second housing 104 can include fan 108 and base 128. Fan 108 can include center shaft 130 and fan blades 132. Base 128 can include stator coils 136.

At least two of fan blades 132 can each include magnet 134. More specifically, as illustrated in FIG. 3, each of fan blades 132a include magnet 134 or at least a portion of magnet 134. (Note that for clarity, not all fan blades with a magnet in FIG. 3 have a reference number). For example, as illustrated in FIG. 3, fan 108 includes eight (8) magnets 134. Note that more than eight (8) magnets may be used or less than eight (8) magnets may be used, depending on design constraints, desired performance, manufacturing costs, etc. Fewer magnets will reduce the revolutions per minute of fan 108 but will decrease the weight of fan 108 while more magnets will increase the revolutions per minute of fan 108 but will also increase the weight of fan 108. In some examples, a plurality of fan blades 132 can include a magnet housing 142. Magnet housing 142 can help secure magnet 134 to one or more fan blades 132a. Magnet housing 142 can be molded into fan blades 132a when fan blades 132 are manufactured or etched, grinded, etc. into fan blades 132 after fan blades 132 are manufactured.

When stator coils 136 are activated by fan engine 112 (illustrated in FIG. 1A), magnets 134 on fan blades 132a interact with stator coils 136 and fan rotation mechanism 126 126 allows fan 108 to rotate. Because magnets 134 are on the outer edge of fan blades 132a and stator coils 136 are located on base 128, the motor portion of fan 108 is located on the periphery of fan 108. This allows fan 108 to be created using a molding process (e.g., a metal injection molding process) with fan blades 132 and center shaft 130 as a single component and reduces the wobble of fan 108 as compared to some current fan designs.

Figure 4:
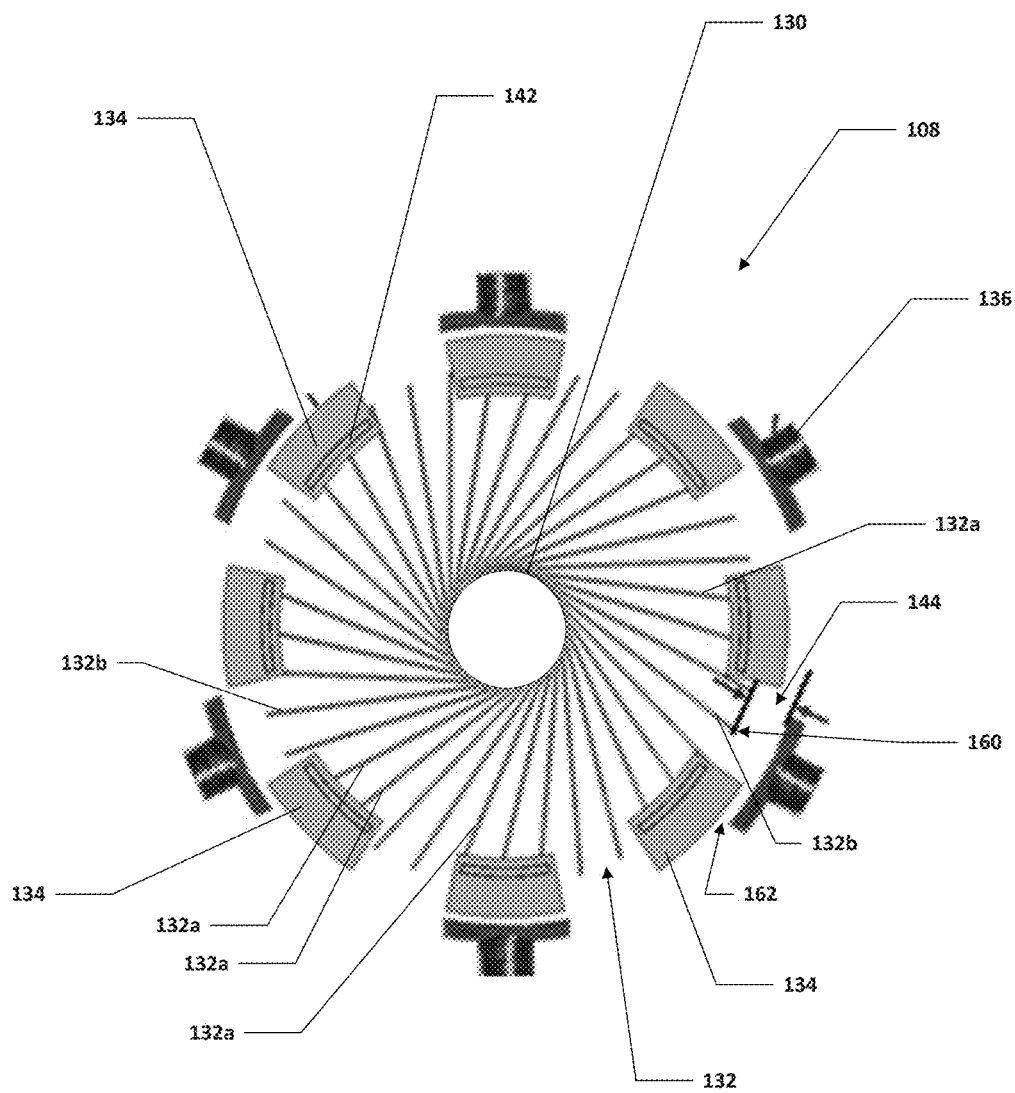
FIG. 4 is a simplified block diagram of a portion of a system to enable a fan for an electronic device, in accordance with an embodiment of the present disclosure.

Turning to FIG. 4, FIG. 4 is a simplified block diagram top cutaway view of a portion of an electronic device that includes a fan for the electronic device, in accordance with an embodiment of the present disclosure. In an example, fan 108 can include center shaft 130 and fan blades 132. Base 128 (not shown) can include stator coils 136. At least two of fan blades 132 can each include magnet 134. More specifically, as illustrated in FIG. 4, each of fan blades 132a include magnet 134 or at least a portion of magnet 134. (Note that for clarity, not all fan blades with a magnet in FIG. 4 have a reference number). For example, as illustrated in FIG. 4, fan 108 includes eight (8) magnets 134. Magnet housing 142 can help secure magnet 134 to one or more fan blades 132a.

In an example, a fan tip to stator coil distance 144 can be configured to help enable airflow from fan 108. Fan tip to stator coil distance 144 is the distance from a tip 160 of fan blades 132b that do not include magnet 134 to stator coils 136. In an example, fan tip to stator coil distance 144 can be about four (4) millimeters or more to allow for airflow. In some examples, fan tip to stator coil distance 144 can be about four (4) millimeters to about six (6) millimeters. In a specific example, fan tip to stator coil distance 144 can be about five (5) millimeters. In an illustrative example, if magnet 134 is four (4) millimeters in length and fan tip to stator coil distance 144 is four (4) millimeters, then tip 160 of fan blade 132b would stop at about the base of magnet 134. In another illustrative example, if magnet 134 is ten (10) millimeters in length and fan tip to stator coil distance 144 is four (4) millimeters, then tip 160 of fan blade 132b would extend along or proximate to the side of magnet 134 about six (6) millimeters from the base of magnet 134. In an example, a magnet to stator coil distance 162 can be about 0.5 millimeters or greater, about one (1) millimeter or less, about 0.5 millimeters to about one (1) millimeter, or any other distance that avoids rubbing and direct contract between magnet 134 and stator coil 136 but still allows stator coil 136 to interact with magnet 134 and cause fan blades 132a to rotate.

When stator coils 136 are activated by fan engine 112 (illustrated in FIG. 1A), magnets 134 on fan blades 132a interact with stator coils 136 and fan rotation mechanism 126 allows fan 108 to rotate. Because magnets 134 are on the outer edge of fan blades 132a and stator coils 136 are located on base 128, the motor portion of fan 108 is located on the periphery of fan 108. This allows fan 108 to be created using a molding process (e.g., a metal injection molding process) with fan blades 132 and center shaft 130 as a single component and reduces the wobble of fan 108 due to misalignment as compared to some current fan designs. The reduction in the wobble of fan 108 allows a gap 140 between center shaft 130 and bottom cover 120 to be relatively small when compared to some current fan designs. For example, gap 140 may be about 0.8 millimeters or less. In another example, gap 140 may be about one (1) millimeter or less. In yet another example, gap 140 may be about 1.5 millimeters or less. In yet another example, gap 140 may be about 0.5 millimeters to about one (1) millimeters. Is still yet another example, gap 140 may be about 0.5 millimeters to about 0.8 millimeters.

Figure 5:
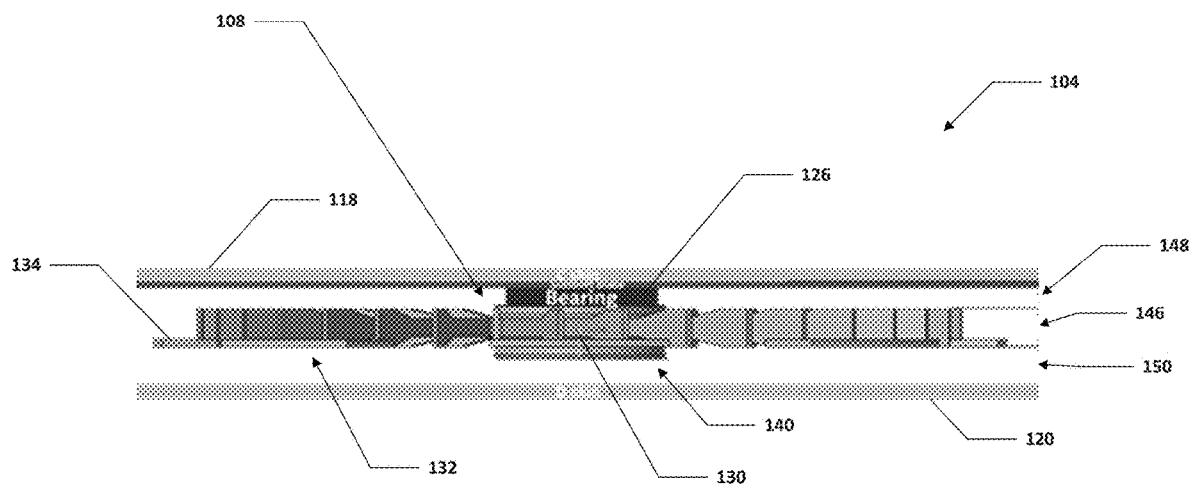
FIG. 5 is a simplified block diagram of a portion of a system to enable a fan for an electronic device, in accordance with an embodiment of the present disclosure.

Turning to FIG. 5, FIG. 5 is a simplified side view cutaway block diagram of a portion of an electronic device that includes a fan for the electronic device, in accordance with an embodiment of the present disclosure. In an example, second housing 104 can include top cover 118 and bottom cover 120. In some examples, second housing 104 may be a standalone device where there is not a first housing (e.g., a tablet, smartphone, etc.). Top cover 118 and bottom cover 120 can be part of the chassis of second housing 104. Second housing 104 can also include fan 108 and fan rotation mechanism 126. Fan 108 can include center shaft 130 and fan blades 132. At least two of fan blades 132 can each include a magnet 134.

When stator coils 136 (illustrated in FIG. 2) are activated by fan engine 112 (illustrated in FIG. 1B), magnets 134 on fan blades 132 interact with stator coils 136 and fan rotation mechanism 126 allows fan 108 to rotate. Because magnets 134 are on the outer edge of fan blades 132a and stator coils 136 (not shown) are located on base 128 (not shown), the motor portion of fan 108 is located on the periphery of fan 108. Because the motor portion of fan 108 is located on the periphery of fan 108, fan 108 can be created using a molding process (e.g., a metal injection molding process) with fan blades 132 and center shaft 130 as a single component. Because fan blades 132 and center shaft 130 are a single component, misalignment between fan blades 132 and center shaft 130 can be reduced and the wobble of fan 108 is reduced as compared to some current fan designs. The reduction in wobble allows gap 140 between center shaft 130 and bottom cover 120 to be relatively small when compared to current fan designs. For example, gap 140 may be about 0.8 millimeters or less. In another example, gap 140 may be about one (1) millimeter or less. In yet another example, gap 140 may be about 1.5 millimeters or less. In yet another example, gap 140 may be about 0.5 millimeters to about one (1) millimeters. Is still yet another example, gap 140 may be about 0.5 millimeters to about 0.8 millimeters.

In some current fan designs, a relatively large gap (e.g., about 1.2-1.5 millimeters) is used to help avoid interference with the rotating parts of the fan and the chassis, especially during wobble of the fan and under external loading conditions. In addition, in some current designs, a thicker chassis/skin in the vicinity of the fan may also be used to help avoid deflection of the chassis and to ensure that the adjacent components not interfere with the rotating parts of the fan Because stator coils 136 are decoupled from center shaft 130 of fan 108 and moved to the periphery of fan 108, the diameter of center shaft 130 can be reduced as compared to some current fan designs. Also, because the wobble is reduced, there is less of a chance the rotating portions of fan 108 will contact the chassis of electronic device 100 and the air gap requirement of some current fans can be reduced. This allows fan blades 132 to have a relatively large fan blade height 146 as compared to some existing fans. Also, a first fan blade clearance 148, or the distance between fan blades 132 and top cover 118, and a second fan blade clearance 150, or the distance between fan blades 132 and bottom cover 120, can be relatively small when compared to some existing fans. Fan blade height 146 can be relatively large and first fan blade clearance 148 and second fan blade clearance 150 can be relatively small because fan 108 does not wobble or the wobble is less than some current fan designs and deflection of the chassis will not cause interference with the rotating parts of fan 108, even under loading conditions. More specifically, fan blade height 146 can be about 3.0 millimeters, about 4 millimeters, about 3 millimeters to about 5 millimeters, above about 3 millimeters, or some other height based on design constraints. First fan blade clearance 148 can be about 1.2 millimeters, about 0.5 millimeters to about 1.5 millimeters, or some other clearance distance based on design constraints. Second fan blade clearance 150 can be about 1.2 millimeters, about 0.5 millimeters to about 1.5 millimeters, or some other clearance distance based on design constraints.

Figure 6:
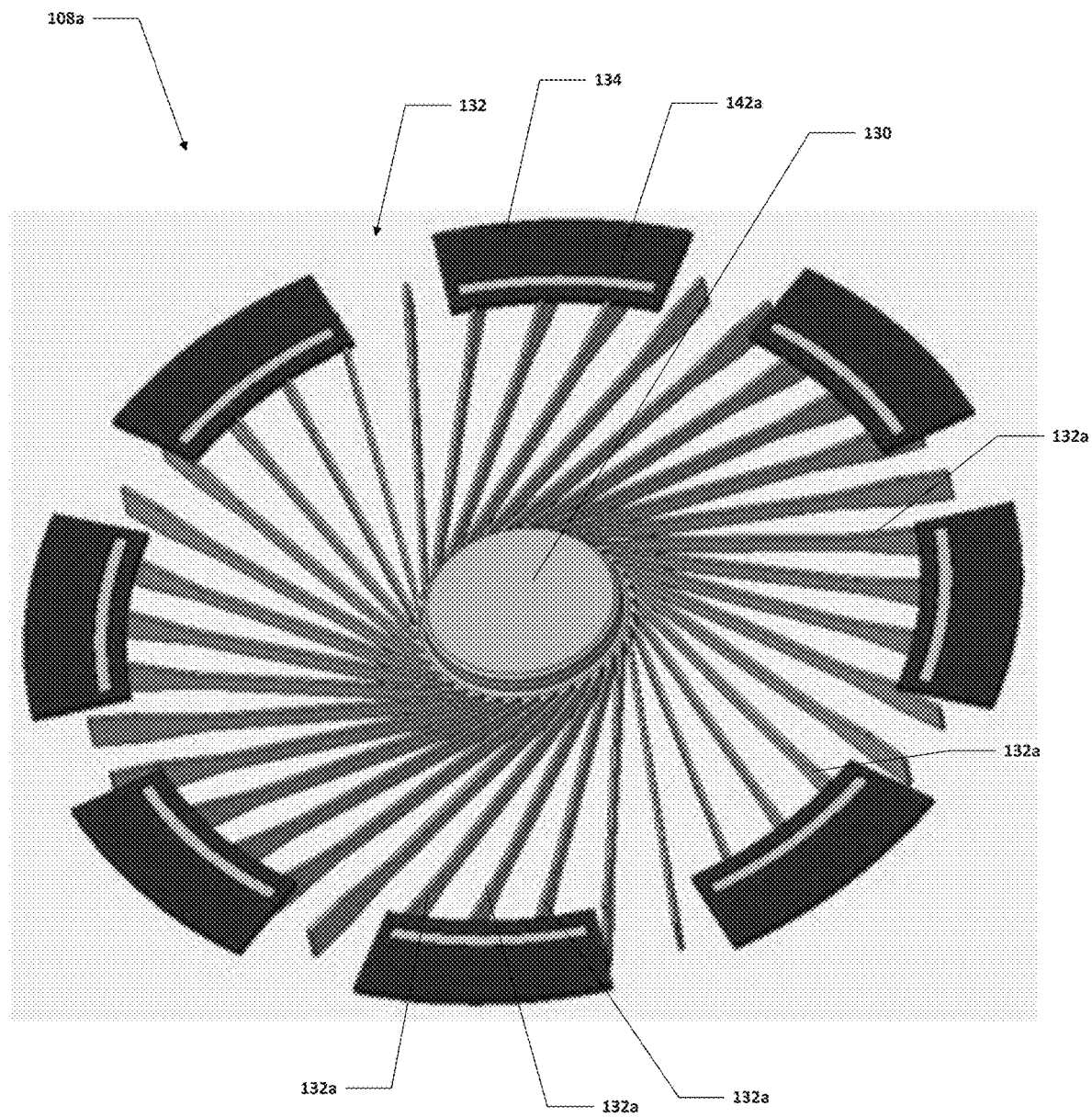
FIG. 6 is a simplified block diagram of a portion of a system to enable a fan for an electronic device, in accordance with an embodiment of the present disclosure.

Turning to FIG. 6, FIG. 6 is a simplified perspective cut away block diagram of a portion of a fan for an electronic device, in accordance with an embodiment of the present disclosure. In an example, a fan 108a can include center shaft 130 and fan blades 132. At least two of fan blades 132 can each include magnet 134. More specifically, as illustrated in FIG. 6, fan blades 132a include magnet 134. (Note that for clarity, not all fan blades with a magnet in FIG. 6 have a reference number). For example, as illustrated in FIG. 6, fan 108a includes eight (8) magnets 134. A magnet housing 142a can help secure magnet 134 to one or more fan blades 134a. Magnet housing 142a can be secured to an end of one or more fan blades 132a. The location of magnet housing 142a depends on design constraints and the size of magnet 134 that will be secured to magnet housing 142a. For example, if magnets 134 are relatively thick and long, then a relatively larger magnet housing 142a can extend over a plurality of fan blades 132a. Also, the location of magnet housing 142a on one or more fan blades 132a can depend on a desired fan tip to stator coil distance 144 (illustrated in FIG. 4). Magnets 134 can be on a first side of magnet housing 142a, on a second side of magnet housing 142a, on alternating sides of magnet housing 142a, embedded in magnet housing 142a, or any combination thereof.

Figure 7:
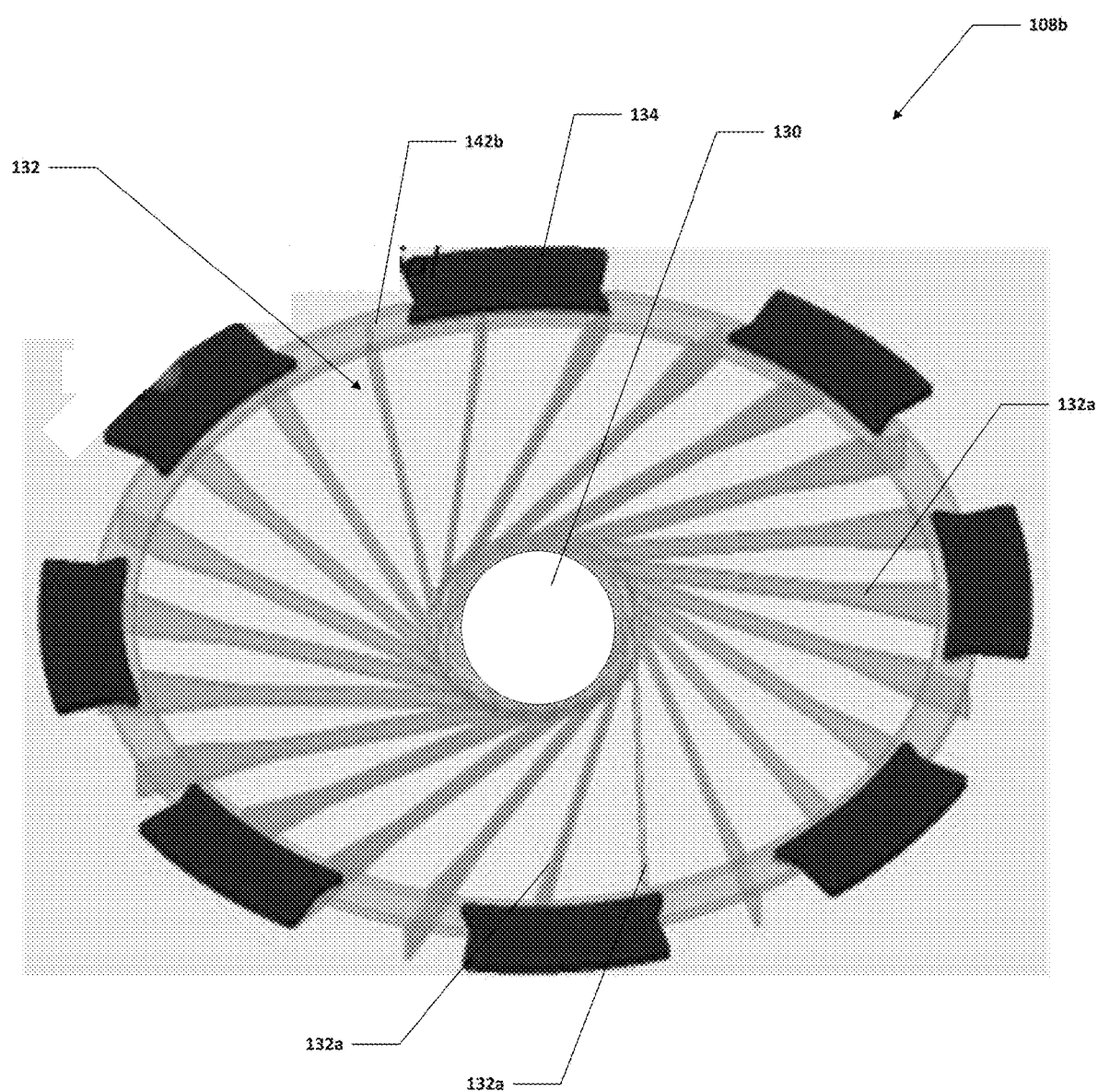
FIG. 7 is a simplified block diagram of a portion of a system to enable a fan for an electronic device, in accordance with an embodiment of the present disclosure.

Turning to FIG. 7, FIG. 7 is a simplified perspective cut away block diagram of a portion of a fan for an electronic device, in accordance with an embodiment of the present disclosure. In an example, a fan 108b can include center shaft 130 and fan blades 132. At least two of fan blades 132 can each include magnet 134. More specifically, as illustrated in FIG. 7, fan blades 132a include magnet 134. (Note that for clarity, not all fan blades with a magnet in FIG. 7 have a reference number). For example, as illustrated in FIG. 7, fan 108b includes eight (8) magnets 134. A magnet housing 142b can help secure magnet 134 to one or more fan blades 132a. As illustrated in FIG. 7, magnet housing 142b is continuous around fan blades 132. In an example, because magnet housing 142b is continuous around fan blades 132, magnets 134 may not be specifically associated with or located on fan blades 132a. The location of magnet housing 142b depends on design constraints and the size of magnet 134 that will be secured to magnet housing 142b. For example, if magnets 134 are relatively thick and long, then a relatively larger or thicker magnet housing 142b can be used to structurally support magnets 134. Also, the location of magnet housing 142b can depend on a desired fan tip to stator coil distance 144 (illustrated in FIG. 4). Magnets 134 can be on a first side of magnet housing 142b, on a second side of magnet housing 142b, on alternating sides of magnet housing 142b, embedded in magnet housing 142b, or any combination thereof.

Figure 8:
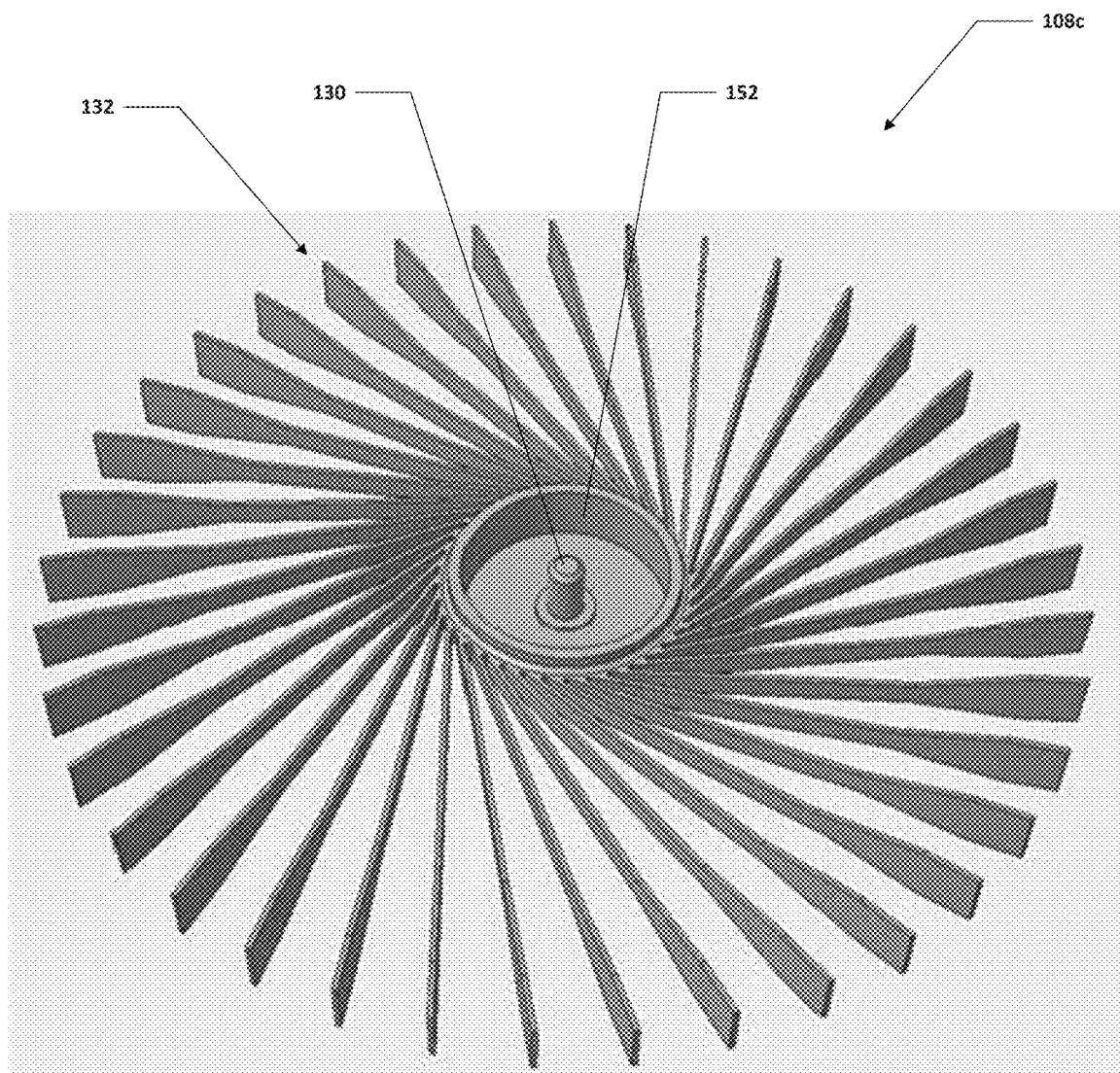
FIG. 8 is a simplified block diagram of a portion of a system to enable a fan for an electronic device, in accordance with an embodiment of the present disclosure.

Turning to FIG. 8, FIG. 8 is a simplified perspective view of a fan 108c created as a single component. Fan 108c can include center shaft 130, fan blades 132, and a hub 152. Center shaft 130, fan blades 132, and hub 152 are all one single component or part. In an example, fan 108c can be manufactured using a molding process. In a specific example, fan 108c can be manufactured using a metal injection molding process. Metal injection molding is a metalworking process in which finely-powdered metal is mixed with binder material to create a feedstock that is then shaped and solidified using injection molding by injecting molten material into a mold.

Hub 152 can be a housing that includes center shaft 130 and bearings (not shown). Because fan 108c is as a single component, the effect of the wobble of fan 108c caused by the misalignment between center shaft 130 and fan blades 132 can be reduced. This creates less wobble while fan 108c is running and allows the height of fan 108c to be increased as well as the velocity of fan 108c and/or the flow rate of air from fan 108c. More specifically, because the wobble of fan 108c is reduced, there is less of a chance the rotating parts of fan 108c will contact the chassis of an electronic device 100.

Figure 9:
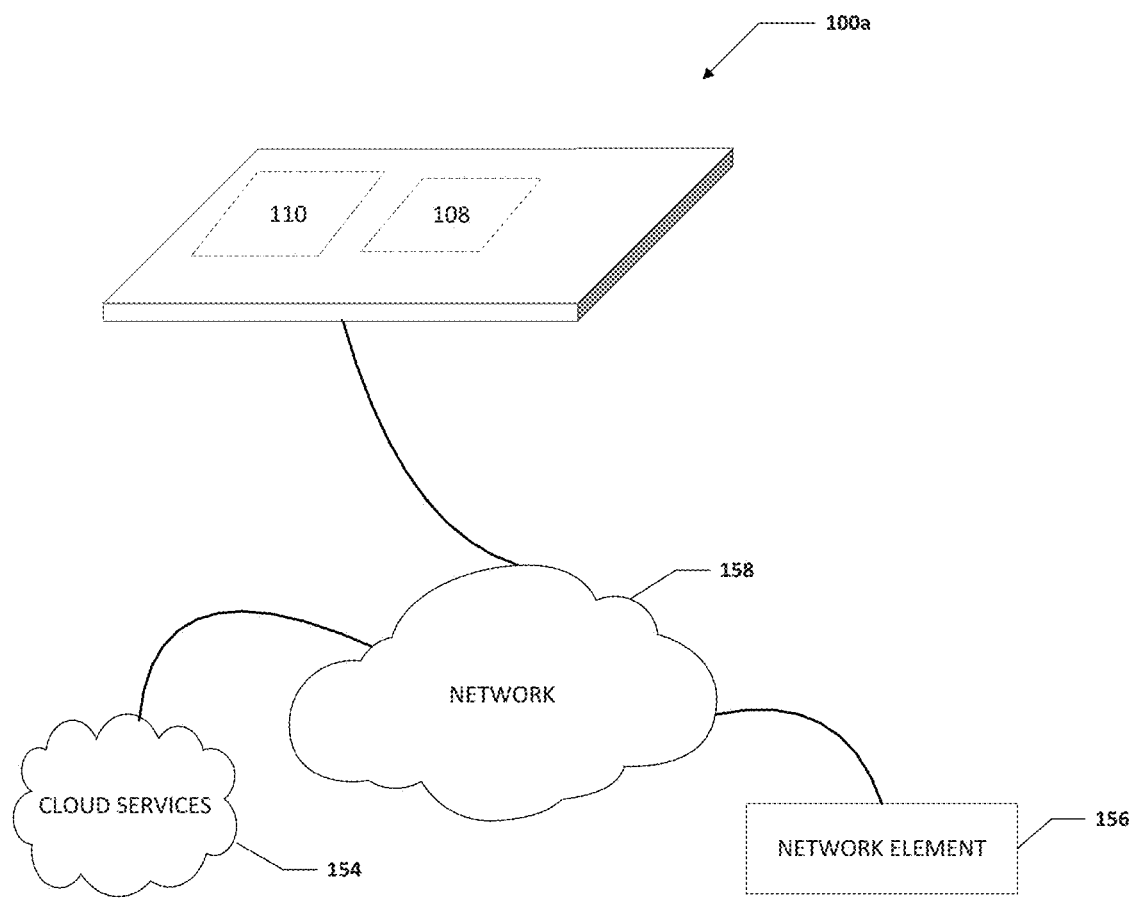
FIG. 9 is a simplified block diagram of an electronic device that includes a fan for the electronic device, in accordance with an embodiment of the present disclosure.

Turning to FIG. 9, FIG. 9 is a simplified block diagram of a portion of an electronic device configured to include a fan. In an example, an electronic device 100a can include fan 108 and heat source 110. Electronic device 100a may be a handheld device, a tablet, smartphone, or other similar device that includes a fan and a heat source. Electronic device 100a may be in communication with cloud services 154 and/or network element 156 using network 158. In an example, electronic device 100a is a standalone device and not connected to network 158.

Elements of FIG. 9 may be coupled to one another through one or more interfaces employing any suitable connections (wired or wireless), which provide viable pathways for network (e.g., network 158) communications. Additionally, any one or more of these elements of FIG. 9 may be combined or removed from the architecture based on particular configuration needs. Network 158 may include a configuration capable of transmission control protocol/Internet protocol (TCP/IP) communications for the transmission or reception of packets in a network. Electronic device 100a may also operate in conjunction with a user datagram protocol/IP (UDP/IP) or any other suitable protocol where appropriate and based on particular needs.

Turning to the infrastructure of FIG. 9, network 158 represents a series of points or nodes of interconnected communication paths for receiving and transmitting packets of information. Network 158 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 158, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks. The data may help determine a status of a network element or network. Additionally, messages, requests, responses, and queries are forms of network traffic, and therefore, may comprise packets, frames, signals, data, etc.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. For example, electronic device 100 and 100a may include two or more fans 108 with each fan 108 being independently controlled by fan engine 112 and/or thermal management engine 114 or controlled as a unit or group. Additionally, although electronic device 100 and 100a have been illustrated with reference to particular elements and operations that facilitate the thermal cooling process, these elements and operations may be replaced by any suitable architecture, protocols, and/or processes that achieve the intended functionality disclosed herein.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes and Examples

In Example A1, fan can include a center shaft, fan blades that extend from the center shaft, where the center shaft and fan blades are a single component made from a same material, and a plurality of magnets on an outside portion of at least two of the fan blades, where stator coils interact with the magnets to drive the fan blades around the center shaft.

In Example A2, the subject matter of Example A1 can optionally include where the center shaft and fan blades were created using a metal injection molding process.

In Example A3, the subject matter of any one of Examples A1-A2 can optionally include where a distance from a tip of a fan blade that does not include a magnet to the stator coils is between about four (4) millimeters to about six (6) millimeters.

In Example A4, the subject matter of any one of Examples A1-A3 can optionally include where the fan blades have a fan blade height of between about three (3) millimeters to about five (5) millimeters.

In Example A5, the subject matter of any one of Examples A1-A4 can optionally include where each of the plurality of magnets are secured to—using a magnet housing.

In Example A6, the subject matter of any one of Examples A1-A5 can optionally include where the stator coils are located on a printed circuit board.

In Example A7, the subject matter of any one of Examples A1-A6 can optionally include where the fan is located in a laptop computer.

Example AA1 is an electronic device including memory, a heat source, a plurality of stator coils, and a fan. The fan can includes a center shaft, fan blades that extend from the center shaft, where the center shaft and fan blades are a single component from a same material, and a plurality of magnets on an outside portion of at least two of the fan blades, where the stator coils interact with the magnets to drive the fan blades around the center shaft.

In Example AA2, the subject matter of Example AA1 can optionally include where the center shaft and fan blades were created using a metal injection molding process.

In Example AA3, the subject matter of any one of Examples AA1-AA2 can optionally include where a distance from a tip of a fan blade that does not include a magnet to the plurality of stator coils is between about four (4) millimeters to about six (6) millimeters.

In Example AA4, the subject matter of any one of Examples AA1-AA3 can optionally include where the fan blades have a fan blade height of between about three (3) millimeters to about five (5) millimeters.

In Example AA5, the subject matter of any one of Examples AA1-AA4 can optionally include where a gap between the center shaft and a cover of the electronic device is about one (1) millimeter or less.

In Example AA6, the subject matter of any one of Examples AA1-AA5 can optionally include where each of the plurality of magnets are secured to the at least two fan blades using a magnet housing.

In Example AA7, the subject matter of any one of Examples AA1-AA6 can optionally include where the stator coils are located on a printed circuit board.

Example M1 is a method including rotating a fan to cool an electronic device. The fan can include a center shaft, fan blades that extend from the center shaft, where the center shaft and fan blades are a single component, and a plurality of magnets on an outside portion of at least two of the fan blades, where stator coils interact with the magnets to rotate the fan blades around the center shaft.

In Example M2, the subject matter of Example M1 can optionally include where the center shaft and fan blades were created using a metal injection molding process.

In Example M3, the subject matter of any one of the Examples M1-M2 can optionally include where a distance from a tip of a fan blade that does not include a magnet to a stator coil is between about four (4) millimeters to about six (6) millimeters.

In Example M4, the subject matter of any one of the Examples M1-M3 can optionally include where each of the plurality of magnets are secured to the at least two fan blades using a magnet housing.

In Example M5, the subject matter of any one of the Examples M1-M4 can optionally include where the fan blades have a fan blade height of between about three (3) millimeters to about five (5) millimeters.

In Example, M6, the subject matter of any one of the Examples M1-M5 can optionally include where a gap between the center shaft and a cover of the electronic device is about one (1) millimeter or less.

Example AAA1 is a device including means for rotating a fan to cool an electronic device. The fan can include a center shaft, fan blades that extend from the center shaft, where the center shaft and fan blades are a single component, and a plurality of magnets on an outside portion of at least two of the fan blades, where stator coils interact with the magnets to rotate the fan blades around the center shaft.

In Example AAA2, the subject matter of Example AAA1 can optionally include where the center shaft and fan blades were created using a metal injection molding process.

In Example AAA3, the subject matter of any one of Examples AAA1-AAA2 can optionally include where a distance from a tip of a fan blade that does not include a magnet to a stator coil is between about four (4) millimeters to about six (6) millimeters.

In Example AAA4, the subject matter of any one of Examples AAA1-AAA3 can optionally include where each of the plurality of magnets are secured to the at least two fan blades using a magnet housing.

In Example AAA5, the subject matter of any one of Examples AAA1-AAA4 can optionally include where the fan blades have a fan blade height of between about three (3) millimeters to about five (5) millimeters.

In Example AAA6, the subject matter of any one of Examples AAA1-AAA5 can optionally include where a gap between the center shaft and a cover of the electronic device is about one (1) millimeter or less.

Example X1 is a machine-readable storage medium including machine-readable instructions to implement a method or realize an apparatus as in any one of the Examples AAA1-AAA7 or M1-M6. Example Y1 is an apparatus comprising means for performing any of the Example methods M1-M6. In Example Y2, the subject matter of Example Y1 can optionally include the means for performing the method comprising a processor and a memory. In Example Y3, the subject matter of Example Y2 can optionally include the memory comprising machine-readable instructions.

What is claimed is:

1. A fan comprising:
    a center shaft;
    fan blades that extend from the center shaft, wherein the center shaft and the fan blades are a single component made from a same non-magnetic material; and
    a plurality of magnets, wherein a magnet from the plurality of magnets is located on an outside portion of at least two of the fan blades, wherein stator coils interact with the plurality of magnets to drive the fan blades around the center shaft, wherein a fan tip to stator coil distance for the fan blades that do not include anter magnet from the plurality of magnets is four (4) millimeters or more and a magnet to stator coil distance is one (1) millimeter or less such that an end of each of the plurality of magnets extends past a tip of the fan blades that do not include ara magnet by at least three (3) millimeters or more.

2. The fan of claim 1, wherein the center shaft and the fan blades were created using a metal injection molding process.

3. The fan of claim 1, wherein the fan tip to stator coil distance for the fan blades that do not include any magnet from the plurality of magnets is between four (4) millimeters to six (6) millimeters.

4. The fan of claim 1, wherein the fan blades have a fan blade height of between three (3) millimeters to five (5) millimeters.

5. The fan of claim 1, wherein the magnet from the plurality of magnets located on the outside portion of the at least two of the fan blades is secured to the outside portion of each of the at least two fan blades using a magnet housing.

6. The fan of claim 1, wherein the stator coils are located on a printed circuit board.

7. The fan of claim 1, wherein the fan is located in a laptop computer.

8. An electronic device comprising:
    memory;
    a heat source;
    a plurality of stator coils; and
    a fan, wherein the fan includes:
        a center shaft;
        fan blades that extend from the center shaft, wherein the center shaft and the fan blades are a single component from a same non-magnetic material; and
        a plurality of magnets, wherein a magnet from the plurality of magnets is located on an outside portion of at least two of the fan blades, wherein the stator coils interact with the plurality of magnets to drive the fan blades around the center shaft, wherein a fan tip to stator coil distance for the fan blades that do not include anter magnet from the plurality of magnets is four (4) millimeters or more and a magnet to stator coil distance is one (1) millimeter or less such that an end of each of the plurality of magnets extends past a tip of the fan blades that do not include anter magnet by at least three (3) millimeters or more.

9. The electronic device of claim 8, wherein the center shaft and the fan blades were created using a metal injection molding process.

10. The electronic device of claim 8, wherein the fan tip to stator coil distance for the fan blades that do not include anter magnet from the plurality of magnets is between four (4) millimeters to six (6) millimeters.

11. The electronic device of claim 8, wherein the fan blades have a fan blade height of between three (3) millimeters to five (5) millimeters.

12. The electronic device of claim 8, wherein a gap between the center shaft and a cover of the electronic device is one (1) millimeter or less.

13. The electronic device of claim 8, wherein the magnet from the plurality of magnets located on the outside portion of the at least two of the fan blades is secured to the outside portion of each of the at least two fan blades using a magnet housing.

14. The electronic device of claim 8, wherein the stator coils are located on a printed circuit board.

15. A method comprising:
rotating a fan to cool an electronic device, wherein the fan includes:
 a center shaft;
 fan blades that extend from the center shaft, wherein the center shaft and the fan blades are a single component; and
 a plurality of magnets, wherein a magnet from the plurality of magnets is located on an outside portion of at least two of the fan blades, wherein stator coils interact with the plurality of magnets to drive the fan blades around the center shaft, wherein a fan tip to stator coil distance for the fan blades that do not include anter magnet from the plurality of magnets is four (4) millimeters or more and a magnet to stator coil distance is one (1) millimeter or less such that an end of each of the plurality of magnets extends past a tip of the fan blades that do not include any magnet by at least three (3) millimeters or more.

16. The method of claim 15, wherein the center shaft and the fan blades were created using a metal injection molding process.

17. The method of claim 15, wherein the fan tip to stator coil distance for the fan blades that do not include any magnet from the plurality of magnets is between four (4) millimeters to six (6) millimeters.

18. The method of claim 15, wherein the magnet from the plurality of magnets located on the outside portion of the at least two of the fan blades is secured to the outside portion of each of the at least two fan blades.

19. The method of claim 15, wherein the fan blades have a fan blade height of between three (3) millimeters to five (5) millimeters.

20. The method of claim 15, wherein a gap between the center shaft and a cover of the electronic device is one (1) millimeter or less.

* * * * *

UNITED STATES PATENT AND TRADEMARK OFFICE
CERTIFICATE OF CORRECTION

PATENT NO. : 11,895,803 B2
APPLICATION NO. : 16/914311
DATED : February 6, 2024
INVENTOR(S) : Varadarajan et al.

It is certified that error appears in the above-identified patent and that said Letters Patent is hereby corrected as shown below:

In the Claims

In Column 16, Claim 1, Line 12, delete "anter" and insert -- any --, therefor.

In Column 16, Claim 1, Line 17, delete "ara" and insert -- any --, therefor.

In Column 16, Claim 8, Line 51, delete "anter" and insert -- any --, therefor.

In Column 16, Claim 8, Line 56, delete "anter" and insert -- any --, therefor.

In Column 16, Claim 10, Line 63, delete "anter" and insert -- any --, therefor.

In Column 17, Claim 15, Line 24, delete "anter" and insert -- any --, therefor.

Signed and Sealed this
Twenty-sixth Day of November, 2024

Katherine Kelly Vidal
*Director of the United States Patent and Trademark Office*